(12) United States Patent
Agarwal et al.

(10) Patent No.: US 6,833,576 B2
(45) Date of Patent: Dec. 21, 2004

(54) METHODS FOR FORMING AND INTEGRATED CIRCUIT STRUCTURES CONTAINING RUTHENIUM AND TUNGSTEN CONTAINING LAYERS

(75) Inventors: Vishnu K. Agarwal, Boise, ID (US); Garo Derderian, Boise, ID (US); Gurtej S. Sandhu, Boise, ID (US); Weimin M. Li, Boise, ID (US); Mark Visokay, Richardson, TX (US); Cem Basceri, Boise, ID (US); Sam Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/002,779

(22) Filed: Oct. 29, 2001

(65) Prior Publication Data

US 2002/0037630 A1 Mar. 28, 2002

Related U.S. Application Data

(62) Division of application No. 09/590,795, filed on Jun. 8, 2000.

(51) Int. Cl.[7] ............................................. H01L 27/108
(52) U.S. Cl. ...................................... 257/300; 257/310
(58) Field of Search ................................ 438/618, 620, 438/622, 626–628, 643–645; 257/306, 310, 300

(56) References Cited

U.S. PATENT DOCUMENTS

| | | |
|---|---|---|
| 4,105,442 A | 8/1978 | Fieberg et al. |
| 4,132,569 A | 1/1979 | DePablo et al. |

(List continued on next page.)

FOREIGN PATENT DOCUMENTS

| | | |
|---|---|---|
| JP | 57075653 | 1/1983 |
| JP | 94057610 | 5/1987 |
| JP | 62256931 | 11/1987 |
| JP | 402197532 | 8/1990 |
| JP | 91021490 | 3/1991 |

OTHER PUBLICATIONS

Kawahara, Takaaki et al., "(Ba, Sr)TiO₃ Films Prepared by Liquid Source Chemical Vapor Deposition on Ru Electrodes," *Jpn. J. Appl. Phys.*, 35:4880–4885 (1996).

(List continued on next page.)

Primary Examiner—David Nelms
Assistant Examiner—David Vu
(74) Attorney, Agent, or Firm—Klarquist Sparkman, LLP

(57) ABSTRACT

Capacitors having increased capacitance include an enhanced-surface-area (rough-surfaced) electrically conductive layer or other layers that are compatible with the high-dielectric constant materials. In one approach, an enhanced-surface-area electrically conductive layer for such capacitors is formed by processing a ruthenium oxide layer at high temperature at or above 500° C. and low pressure 75 torr or below, most desirably 5 torr or below, to produce a roughened ruthenium layer having a textured surface with a mean feature size of at least about 100 Angstroms. The initial ruthenium oxide layer may be provided by chemical vapor deposition techniques or sputtering techniques or the like. The layer may be formed over an underlying electrically conductive layer. The processing may be performed in an inert ambient or in a reducing ambient. A nitrogen-supplying ambient or nitrogen-supplying reducing ambient may be used during the processing or afterwards to passivate the ruthenium for improved compatibility with high-dielectric-constant dielectric materials. Processing in an oxidizing ambient may also be performed to passivate the roughened layer. The roughened layer of ruthenium may be used to form an enhanced-surface-area electrically conductive layer. The resulting enhanced-surface-area electrically conductive layer may form a plate of a storage capacitor in an integrated circuit, such as in a memory cell of a DRAM or the like. In another approach, a tungsten nitride layer is provided as an first electrode of such a capacitor. The capacitor, or at least the tungsten nitride layer, is annealed to increase the capacitance of the capacitor.

13 Claims, 4 Drawing Sheets

U.S. PATENT DOCUMENTS

| | | | |
|---|---|---|---|
| 4,564,702 A | * | 1/1986 | Wennerberg ............... 562/493 |
| 4,851,895 A | * | 7/1989 | Green et al. ............... 257/751 |
| 5,068,199 A | | 11/1991 | Sandhu |
| 5,109,238 A | * | 4/1992 | Watanabe et al. ........... 347/204 |
| 5,130,885 A | | 7/1992 | Fazan et al. |
| 5,318,920 A | | 6/1994 | Hayashide |
| 5,342,800 A | | 8/1994 | Jun |
| 5,358,889 A | | 10/1994 | Emesh et al. |
| 5,364,813 A | | 11/1994 | Koh |
| 5,372,962 A | | 12/1994 | Hirota et al. |
| 5,427,974 A | | 6/1995 | Lur et al. |
| 5,466,310 A | | 11/1995 | Ninham et al. |
| 5,608,247 A | | 3/1997 | Brown |
| 5,612,560 A | | 3/1997 | Chivukula et al. |
| 5,696,014 A | | 12/1997 | Figura |
| 5,696,017 A | | 12/1997 | Ueno |
| 5,834,357 A | | 11/1998 | Kang |
| 5,852,307 A | | 12/1998 | Aoyama et al. |
| 5,877,063 A | | 3/1999 | Gilchrist |
| 5,893,731 A | | 4/1999 | Lee et al. |
| 5,923,999 A | | 7/1999 | Balasubramanyam et al. |
| 5,926,360 A | | 7/1999 | Laibowitz et al. |
| 5,930,584 A | | 7/1999 | Sun et al. |
| 5,959,327 A | | 9/1999 | Sandhu et al. |
| 5,962,065 A | | 10/1999 | Weimer et al. |
| 5,985,714 A | | 11/1999 | Sandhu et al. |
| 6,015,743 A | | 1/2000 | Zahurak et al. |
| 6,037,220 A | | 3/2000 | Chien et al. |
| 6,049,101 A | | 4/2000 | Graettinger et al. |
| 6,060,351 A | | 5/2000 | Parekh et al. |
| 6,060,367 A | | 5/2000 | Sze |
| 6,204,203 B1 | | 3/2001 | Narwankar et al. |
| 6,218,233 B1 | * | 4/2001 | Takemura ............... 438/240 |
| 6,294,807 B1 | | 9/2001 | Chittipeddi et al. |
| 6,309,713 B1 | | 10/2001 | Mak et al. |
| 6,344,413 B1 | | 2/2002 | Zurcher et al. |
| 6,365,502 B1 | * | 4/2002 | Paranjpe et al. ............ 438/622 |
| 6,409,904 B1 | * | 6/2002 | Uzoh et al. ............... 205/137 |
| 6,436,786 B1 | | 8/2002 | Tsuzumitani et al. |
| 6,458,651 B2 | | 10/2002 | Rhodes |
| 6,635,523 B1 | | 10/2003 | Uchiyama et al. |

OTHER PUBLICATIONS

Kaga et al., "Thermal Stability of RUO2 Thin Films and Effects of Annealing Ambient on Their Reduction Process," *Jpn. J. Appl. Phys.*, 38:3689–3692 (1999).

Hayashide et al., "Fabrication of Storage Capacitance–Enhanced Capacitors with a Rough Electrode," *Japanese Jpn. J. Appl. Phys.*, pp. 869–872 (1990).

Matsui et al., "Thermal Stability of a RUO2 Electrode Prepared by DC Reactive Sputtering," *Jpn. J. Appl. Phys.*, 39:256–263 (2000).

* cited by examiner

METHODS FOR FORMING AND INTEGRATED CIRCUIT STRUCTURES CONTAINING RUTHENIUM AND TUNGSTEN CONTAINING LAYERS

This application is a divisional application of Application Ser. No. 09/590,795, filed Jun. 8, 2000.

FIELD

The invention pertains to semiconductor devices and the fabrication thereof, and particularly to ruthenium- and tungsten-containing electrically conductive layers and the formation and use thereof.

BACKGROUND

A capacitor generally includes two electrical conductors in close proximity to, but separated from, each other. The two conductors form the "plates" of the capacitor, and may be separated by a dielectric material. When a voltage is applied across the plates of a capacitor, electrical charge accumulates on the plates. If the plates are electrically isolated essentially immediately after a voltage is applied, the accumulated charge may be stored on the plates, thus "storing" the applied voltage difference.

The fabrication of integrated circuits involves the formation of electrically conductive layers for use as various circuit components, including for use as capacitor plates. Memory circuits, such as DRAMs and the like, use electrically conductive layers to form the opposing plates of storage cell capacitors.

The drive for higher-performance, lower-cost integrated circuits dictates ever-decreasing area for individual circuit features, including storage capacitors. Since capacitance of a capacitor (the amount of charge that can be stored as a function of applied voltage) generally varies with the area of capacitor plates, as the circuit area occupied by the storage capacitor decreases, it is desirable to take steps to preserve or increase capacitance despite the smaller occupied area, so that circuit function is not compromised.

Various steps may be taken to increase or preserve capacitance without increasing the occupied area. For example, material(s) having higher dielectric constant may be used between the capacitor plates. Further, the plate surfaces may be roughened to increase the effective surface area of the plates without increasing the area occupied by he capacitor.

One method for providing a roughened surface for a plate of a storage cell capacitor is to form the plate of hemispherical grain polysilicon (HSG), possibly with an overlying metal layer. The hemispherical grains of HSG enhance the surface area of the plate without increasing its occupied area.

HSG presents difficulties in fabrication, however, because of the formation of silicon dioxide on and near the HSG. A silicon dioxide layer may form on the HSG, particularly during deposition of the capacitor's dielectric layer. Even with an intervening metal layer present, oxygen from the deposition of the dielectric layer can diffuse through the metal layer, forming silicon dioxide at the polysilicon surface. Silicon diffusion through the metal layer may also produce a silicon dioxide layer between the metal and the dielectric layers.

Silicon dioxide between the metal layer and the HSG can degrade the electrical contact to the metal capacitor plate surface. Silicon dioxide between the metal layer and the dielectric layer can decrease the capacitance of the resulting capacitor.

To attempt to avoid these negative effects caused by formation of silicon dioxide, a diffusion barrier layer may be employed between the HSG and the metal layer. However, in the typical capacitor geometry, the greater the total number of layers, the larger the required minimum area occupied by the capacitor. Further, the upper surface of each additional layer deposited tends to be smoother than the underlying surface, reducing the increased surface area provided by an underlying rough layer.

While high-dielectric constant materials are known, many of these advantageous materials are formed with processes that are incompatible with other materials needed to form capacitors. For example, processes needed to form a particular dielectric layer can oxidize or otherwise impair the properties of the electrode layer on which the dielectric layer is to be formed. These processes can be incompatible because of the necessary process temperatures or process ambients.

For these reasons, improved materials and methods are needed for forming conducting layers, insulating layers, and capacitors using such layers.

SUMMARY

The present invention provides improved conductive layers, dielectric layers, capacitors, methods for forming such layers, and capacitors using the layers.

In a representative embodiment, enhanced-surface-area (rough-surfaced) ruthenium containing electrically conductive layers are provided. These layers are compatible with high-dielectric-constant materials and are useful in the formation of integrated circuits, particularly for plates of storage capacitors in memory cells.

In one approach, the enhanced-surface-area electrically conductive layer may be formed by first forming a ruthenium oxide containing film or layer. The layer may be stoichiometric or non-stoichiometric, and may be amorphous or may have both ruthenium (Ru) and ruthenium oxide ($RuO_2$) phases and may include other materials. The film may be formed, for example, by chemical vapor deposition techniques or by sputtering or any suitable techniques. The film may be formed over an underlying layer which may be electrically conductive.

The ruthenium oxide film may be processed at low pressure and high temperature—generally at pressures at least about 75 torr or below, desirably about 20 torr or below, most desirably about 5 torr or below—and at temperatures in the range of about 500 to 900° C., desirably about 750 to about 850° C.—so as to convert at least some of the ruthenium oxide to ruthenium and to yield a roughened ruthenium-containing layer with a mean grain size desirably in the range of about 100 Angstroms or larger.

The heating process, or anneal, is desirably performed in a non-oxidizing ambient. In an example embodiment, a nitrogen-supplying ambient or nitrogen-supplying reducing ambient may be used during the anneal. A nitrogen-supplying reducing ambient may be used to passivate the ruthenium for improved compatibility with high-dielectric-constant dielectric materials. In another alternative, a nitrogen-supplying reducing ambient may be used in a post-anneal to passivate an already roughened layer. In still another alternative, a post-anneal in an oxidizing ambient may be performed, following either the roughening anneal or the nitride-passivation anneal, as desired. This oxidizing post-anneal provides oxygen to the roughened layer to reduce the tendency of the ruthenium to scavenge oxygen during later processing.

The enhanced-surface-area layer may be formed with or without a pre-anneal, performed at a higher pressure (such as about 600 torr), before the low pressure, high temperature anneal.

The roughened layer of ruthenium may be used to provide an enhanced-surface-area electrically conductive layer.

In an example embodiment, the roughened layer of ruthenium may be formed on an underlying electrically conductive layer, with the roughened layer and the underlying layer together functioning as an enhanced-surface-area electrically conductive layer.

In another example embodiment, an electrically conductive layer may be formed on or over the roughened layer, with the overlying electrically conductive layer and the roughened layer constituting an enhanced-surface area electrically conductive layer.

In either case, in an example capacitor embodiment for use in an integrated circuit, the resulting enhanced-surface-area electrically conductive layer may be used to form a plate of a storage capacitor in an integrated circuit, such as in a memory cell of a DRAM or the like.

The ruthenium-containing enhanced-surface-area electrically conductive layer, particularly in the case of an anneal in nitrogen-supplying reducing ambient with an oxidizing post-anneal, has reduced tendency toward oxidation and is thus more compatible with the use of high-dielectric-constant dielectric materials, while still providing enhanced surface area. In addition, even if the ruthenium-containing layer oxidizes, it remains conductive. An additional metal layer thus may potentially be omitted from the capacitor structure, allowing smaller dimensions for capacitors with the same or even greater capacitance.

In an alternative embodiment, a tungsten nitride layer is provided as a first electrode layer. A dielectric layer and a second electrode layer are conformally applied to the first electrode layer to form a capacitor. The capacitor, or at least the tungsten nitride layer, is annealed at an anneal temperature to increase the capacitance of the capacitor. In a specific embodiment, the anneal temperature is at least 500 C and the capacitor (or the tungsten nitride layer) is maintained at the anneal temperature for at least 30 seconds.

These methods, conductive and dielectric layers, and structures using the layers allow the design and fabrication of higher speed, higher density, and lower cost integrated circuits.

DETAILED DESCRIPTION

The present invention allows creation of a surface-area-enhanced ruthenium electrically conductive layer that has improved compatibility with high-dielectric-constant ("high-κ") dielectric materials as compared to hemispherical-grain polysilicon (HSG).

Figure 1:
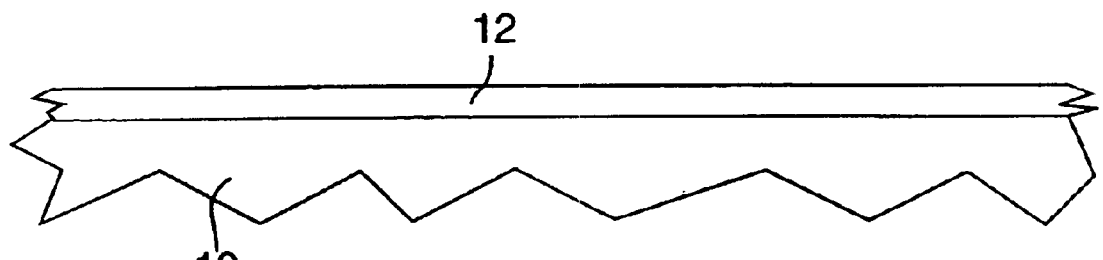
FIG. 1 is a partial cross-section of layers used in a process according to one embodiment, the layers including a ruthenium oxide containing layer.

The surface-area-enhanced electrically conductive layer is created by heating a film or layer comprising ruthenium oxide such as the layer 12 of FIG. 1. The heating process, which may anneal the film or layer, is typically performed at low pressures of less than about 75 torr, desirably less than about 20 torr, and most desirably less than about 5 torr, and at high temperatures in the range of about 500 to 900° C., desirably about 750 to 850° C. The treatment is desirably performed in a non-oxidizing ambient. The heating process may be performed in a noble ambient, nitrogen ambient, or the like, or in a reducing ambient, which may reduce the temperature required. The heating process may also be performed in an electrically neutral environment, or with plasma or glow-discharge assistance or the like, which may also reduce the temperature required. Heating under relatively low pressure converts at least a portion of the ruthenium oxide to ruthenium and produces a rough surface on the layer. Temperature and pressure are preferably selected so as to enhance the ruthenium oxide to ruthenium conversion.

The surface-area-enhanced electrically conductive layer may be formed on a supporting structure 10 shown in partial cross-section in FIG. 1. The supporting structure 10 may be any structure present in or on an integrated circuit during the fabrication thereof. In a typical example application, the supporting structure may be an electrically conductive material that will be in electrical contact with a capacitor plate formed by the surface-area-enhanced electrically conductive layer.

The ruthenium oxide layer 12 may be formed by any suitable method. Specific examples of such methods include chemical vapor deposition (CVD) or related process, or sputtering or related process, or the like. The ruthenium oxide layer may be stoichiometric ruthenium oxide ($RuO_2$) or non-stoichiometric ruthenium oxide ($RuO_x$).

If the layer 12 is formed via CVD, the deposition may be performed, for example, at pressures of 1–20 torr, desirably about 5 torr. The oxygen may be supplied in the form of $O_2$ or other oxidizing gas, such as $N_2O$, NO, or ozone ($O_3$). The oxygenating gas and a ruthenium precursor, and suitable diluent gasses, if desired, may be supplied at suitable flow rates, such as in the range of about 100–2000 sccm. Alternatively, the ruthenium precursor can be delivered by direct vaporization. Deposition may be performed for a time in the range of about 10 to 500 seconds, desirably for sufficient time and under sufficient conditions to deposit $RuO_x$ or $RuO_2$ to a thickness in the range of about 100 to 600 Angstroms.

The resulting ruthenium oxide layer 12 may optionally be pre-annealed, such as by rapid thermal anneal (RTA) in hydrogen or other suitable anneal environment at pressures in the range of 500 to 700 torr and temperatures in the range of 500 to 900° C. The pre-anneal stabilizes the film, promoting crystallization of ruthenium and ruthenium oxide phases.

The ruthenium oxide layer 12, with or without a pre-anneal, is then treated at low pressure and high temperature as described above. The treatment may reduce the proportion of ruthenium oxide in the layer and increase the proportion of ruthenium. The ruthenium oxide in the ruthenium oxide layer 12 is partially or completely converted to ruthenium by the anneal, leaving an enhanced-surface-area layer 16 shown in the cross section of FIG. 2. While the enhanced-surface-area layer 16 is referred to by separate reference character for convenience herein, it should be noted that the layer 16 is formed from the layer 12, and is the same layer in that sense. FIG. 3 shows a partial plan view of the roughened ruthenium layer 16 of FIG. 2. Although the example roughened ruthenium layer 16 shown in the figures is discontinuous, this is by way of example only and continuous films may also be produced. Increased thickness of the initial layer 12 tends to produce more continuous films, as does reduced temperature and increased pressure during the anneal and reduced anneal time.

The anneal may be performed in a noble, nitrogen, or reducing ambient or the like. As an additional example embodiment, an anneal may be performed in a nitrogen-supplying reducing ambient such as such as ammonia, nitrogen, a nitrogen and hydrogen mixture, and the like. The anneal parameters may be selected such that "nitrogen-passivated" ruthenium in the form of $RuN_x$ is formed in the layer 16, at least near the outermost surfaces thereof, passivating the layer 16.

As another example alternative, nitride passivation may be used in the form of a post-anneal in a nitrogen-supplying reducing ambient.

As yet another variation, a desirably brief post-anneal in an oxidizing ambient such as oxygen or ozone may be performed on the already roughened layer 16, to form "oxygen-passivated" ruthenium or ruthenium nitride in the outermost portions of the layer 16 ($RuO_xN_y$ or $RuO_x$), in order to reduce or prevent the ruthenium from later scavenging oxygen from a nearby dielectric material. The oxidizing post-anneal may optionally follow a nitride passivation post-anneal.

Figure 2:
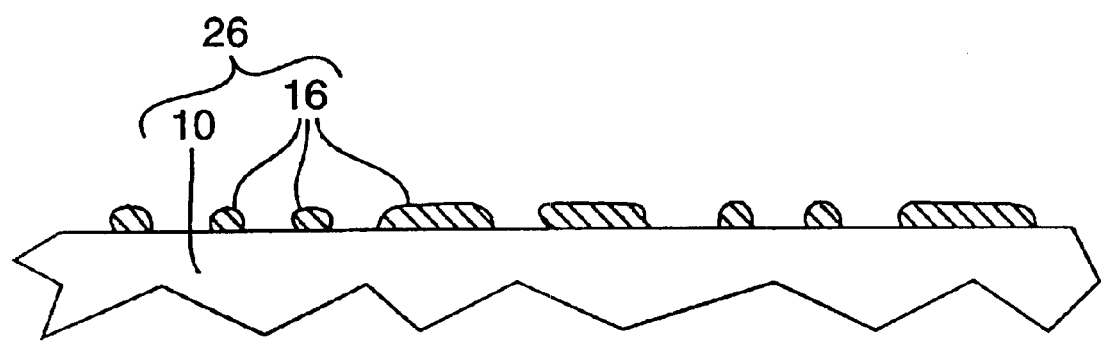
FIG. 2 is a cross-section of the layers of FIG. 1 after a low-pressure, high-temperature anneal, including a roughened layer.
Figure 3:
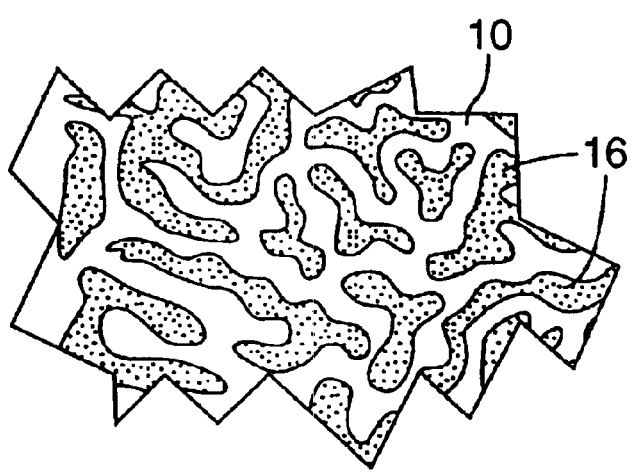
FIG. 3 is a partial plan view of the layers of FIG. 2

As indicated in FIG. 2, the roughened ruthenium layer 16, together with the supporting structure 10 if electrically conductive, may together constitute an enhanced-surface-area electrically conductive layer 26 compatible with high-dielectric-constant dielectric materials.

The layer 16 produced such as described above may also be used in cooperation with other layers. This may be useful in cases where the supporting structure 10 may not be electrically conductive or may be incompatible with high-dielectric-constant dielectric materials. In the discussion and claims herein, "on" used with respect to two layers, one "on" the other, means at least some contact between the layers, while "over" means the layers are in close proximity, but possibly with one or more additional intervening layers such that contact is not required. Neither "on" nor "over" implies any directionality as used herein.

Figure 4:
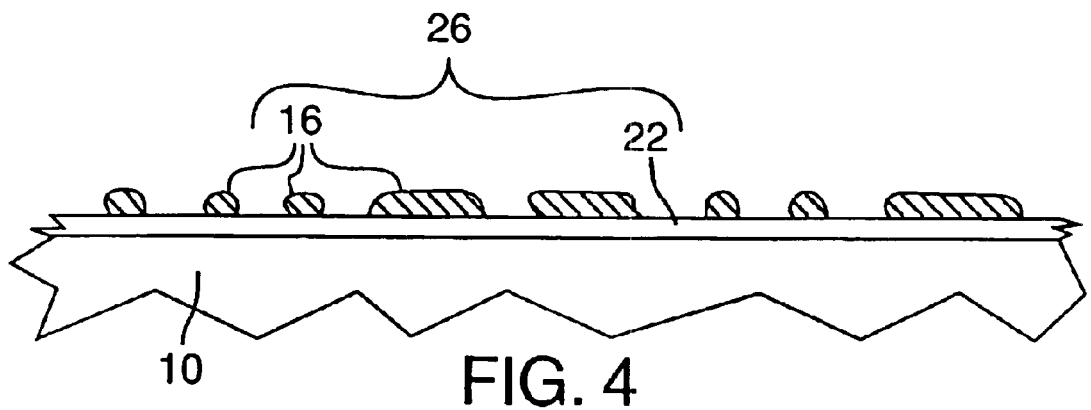
FIG. 4 is a cross-section similar to that of FIG. 2 but having an additional layer underlying the roughened layer.

As shown, for example, in FIG. 4, a layer 22 of material may be formed over the supporting structure 10, with the roughened ruthenium layer 16 then formed on the layer 22. The layer 22 may be an electrically conductive layer to electrically connect all portions of layer 16. The layer 22 may also act as a barrier layer to prevent contact between high-dielectric-constant dielectrics, to be used for capacitor formation, and the supporting structure 10. If the layer 22 is an electrically conductive layer, layer 22 together with layer 16 constitute an enhanced-surface-area electrically conductive layer 26. Any compatible electrically conductive material may be used, such as Pt, Ir, $IrO_x$, Rh, $RuSi_x$, and $SrRuO_x$ and alloys thereof as well as $RuSiO_x$ and $RuSiN_x$, for example.

Figure 5:
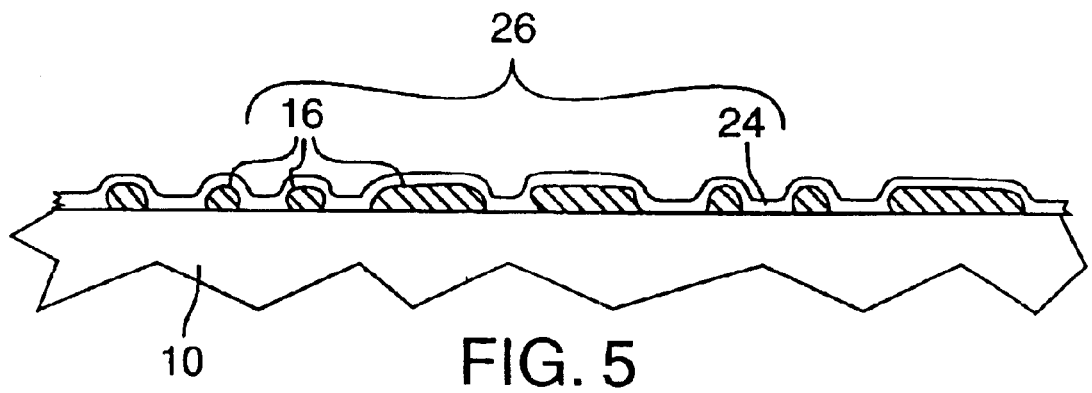
FIG. 5 is a cross section of the layers of FIG. 2 after formation of an additional layer overlying the roughened layer.

Alternatively, as shown for example in FIG. 5, a layer 24 of electrically conductive material may be formed conformally over the layer 16 and over the supporting structure 10. The layer 24, together with the layer 16, then constitutes an enhanced-surface-area electrically conductive layer 26. As with the layer 22, the layer 24 may function to electrically connect all portions of layer 16, and may also function as a barrier layer to prevent contact between high-dielectric-constant dielectrics and the supporting structure 10. Examples of such electrically conductive materials include the materials listed in the preceding paragraph. Ruthenium oxide is a desirable material because of compatibility with the underlying ruthenium layer 16.

Figure 6:
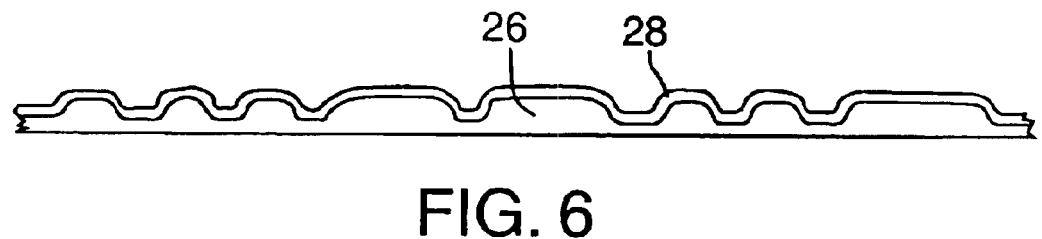
FIG. 6 is a cross section of an enhanced-surface-area electrically conductive layer with a dielectric layer formed thereon according to one embodiment.

As described by way of example above with reference to FIGS. 3–6, the supporting structure 10 and/or one or more layers above or below the layer 16 (or both) may be electrically conductive and may be employed as needed to obtain conductivity and other desired properties. The resulting enhanced-surface-area electrically conductive layer 26, shown by way of example in FIGS. 3, 5, and 6, is represented generically as layer 26 in FIG. 6. To form a capacitor with the enhanced-surface-area electrically conductive layer 26, a layer 28 of dielectric material, most desirably a high-dielectric-constant dielectric material (generally any dielectric with a dielectric constant of at least 9), such as tantalum pentoxide ($Ta_2O_5$), may be formed conformally over the enhanced-surface-area electrically conductive layer, as shown in FIG. 6. Other high-constant dielectrics may also be employed, such as barium strontium titanium oxide $(Ba,Sr)TiO_3$, lead zirconium titanium oxide $Pb(Zr,Ti)O_3$, and strontium bismuth tantalum oxide ($SrBi_2Ta_2O_9$), for example. The layer 28 is desirably sufficiently thin and conforming to provide an at least somewhat enhanced surface area on the surface away from the layer 26.

Figure 7:
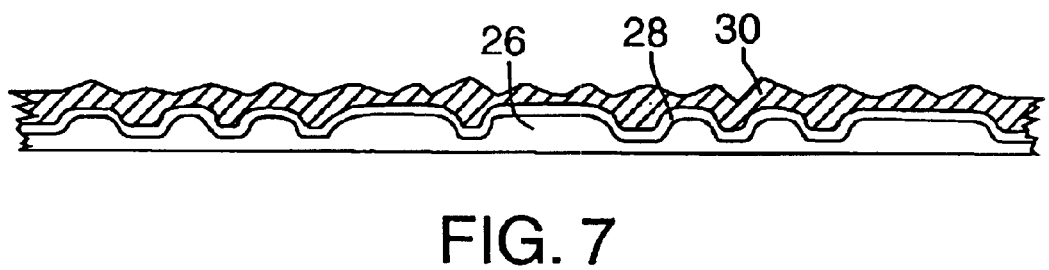
FIG. 7 is a cross section of the layers of FIG. 6 with an electrically conductive layer formed on the dielectric layer.

An electrically conductive layer 30 may then be formed conformally over the dielectric layer 28, as shown in FIG. 7. The surface of layer 30 uppermost in the figure is not shown because the layer may generally be of any thickness sufficiently thick to insure continuity of the layer and sufficiently thin to fit within the overall volume allotted to the capacitor. As shown in FIG. 7, the surface of layer 30 next to the dielectric layer 28 desirably conforms to the enhanced surface area of the dielectric layer 28, providing an enhanced surface area for the electrically conductive layer 30 as well. The two electrically conductive layers, layers 26 and 30, form the two plates of a capacitor. Both plates desirably have enhanced surface area relative to the area occupied by the capacitor.

Figure 8A:
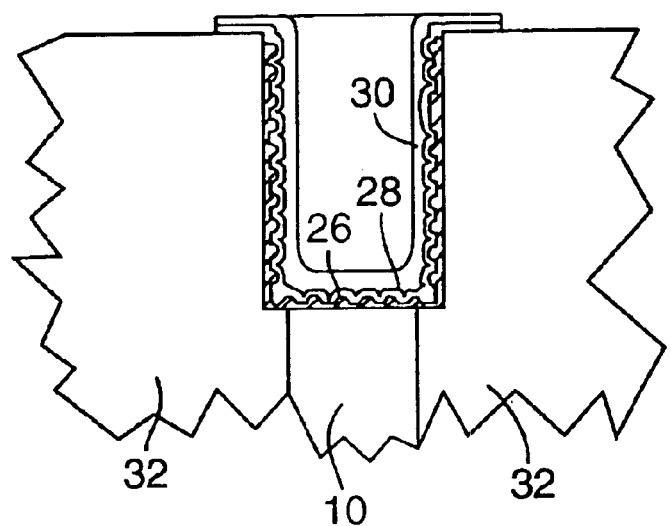
FIGS. 8A–8B are cross-sections of two embodiments of capacitor structures that include a roughened layer.

Application of the plate structure shown in FIG. 7 to a container capacitor is illustrated in the cross-section of a container capacitor shown in FIG. 8A. The supporting structure 10 may be an electrically conductive plug of polysilicon or other electrically conductive material formed at the bottom of an opening in a dielectric material 32 such as borophosphosilicate glass (BPSG). The lower end of the plug typically electrically contacts a circuit element such as a transistor gate (not shown). At the sides of the cylindrical container, the BPSG itself functions a supporting structure for the capacitor plate structure. The relative thinness of the capacitor structure provided by the layer structure of FIG. 7 maximizes the capacitor plate surface area in the container capacitor of FIG. 8A, particularly for the inner (upper) electrode, the surface area of which decreases most rapidly with increasing thickness of the layer structure. The use of the enhanced-surface-area ruthenium electrically conductive layer thus provides improved capacitance in a given area.

Figure 8B:
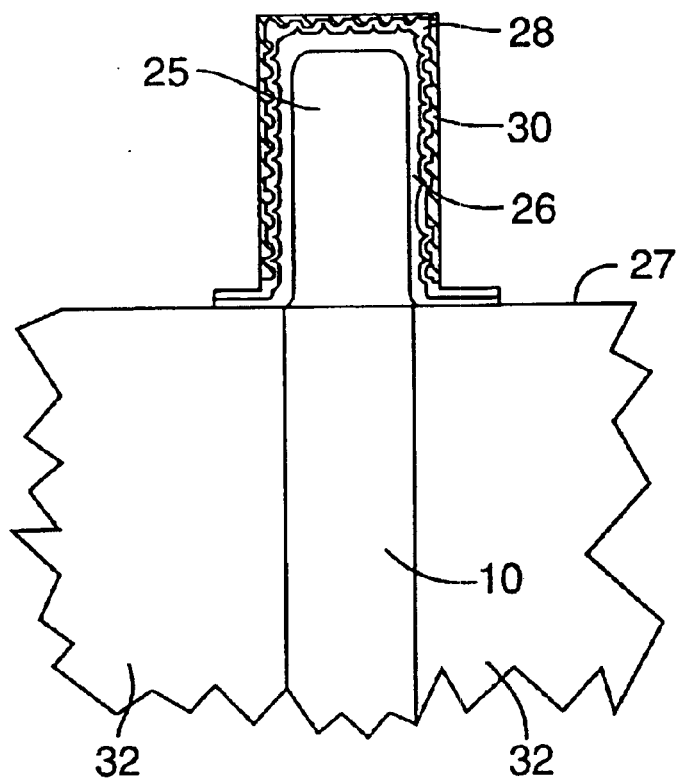

Application of the plate structure shown in FIG. 7 to a stud capacitor is illustrated in the cross-section of a stud capacitor shown in FIG. 8B. The supporting structure 10 includes a plug 25 that extends from a surface 27 and the layers 26, 28, 30 are formed conformally on the plug 25.

In a specific example, ruthenium oxide was deposited on substrates of BPSG to a thickness of about 600 Angstroms by CVD. The ruthenium oxide layers were pre-annealed in nitrogen for one minute at 800° C. and 600 torr, then annealed at 800° C. in nitrogen for varying times and at varying pressures. Such a pre-anneal can be omitted.

On SEM examination, layers annealed for eight minutes at 4.5 torr showed marked surface roughness with mean grain size of about 100 Angstroms or larger, with good uniformity over the substrate surface. Layers annealed for eight minutes at 60 torr showed some surface roughness with a mean grain approaching 100 Angstroms, but with generally less roughness than at 4.5 torr. Layers annealed for eight minutes at 600 torr showed generally still less roughness and still smaller grain sizes than at 60 torr. Layers annealed for two minutes at 4.5 torr also showed a marked surface roughness, with possibly slightly less uniformity over the substrate surface than those annealed for eight minutes. X-ray diffraction studies of the annealed layers showed ruthenium as the primary constituent but the $Ru/RuO_2$ ratio varied with processing conditions.

Superior capacitors including metal-insulator-metal (MIM) capacitors can be obtained using a tungsten nitride layer as an electrode. The tungsten nitride layer can be formed by reactive sputtering of a tungsten target in a nitrogen containing ambient, or by a chemical vapor deposition process (CVD) such as a plasma enhanced CVD (PECVD), a metallo-organic CVD (MOCVD) process, atomic layer deposition (ALD), or other process. The tungsten nitride layer is conveniently formed using a thermal CVD process using tungsten fluoride ($WF_6$) and ammonia ($NH_3$) as precursors, and a 300 Angstrom thick layer can be formed using such a process in about 1–3 minutes. The thickness of the tungsten nitride layer can be varied but typically the thickness is in the range of 100–1000 Angstroms.

As deposited, the tungsten nitride layer can contain a mixture of a stable tungsten nitride compound $W_2N$ and a metastable tungsten nitride compound WN. The metastable compound WN can be converted to the stable tungsten nitride compound $W_2N$ in a rapid thermal process (RTP) in which the temperature of the tungsten nitride layer is rapidly raised to an anneal temperature in the range of 600–800 C and held at the anneal temperature for about 60 seconds. Typically, the temperature of the tungsten nitride layer is ramped up to and down from an anneal temperature of 700 C in less than about 30 seconds. Such an anneal process is typically performed before a dielectric layer and a second electrode are formed on the tungsten nitride layer so that a capacitor structure is otherwise complete. The metastable compound WN may include defects and may be preferentially oxidized during deposition of dielectric materials such as $Ta_2O_5$ and subsequent annealing processes. Therefore, the capacitance of a capacitor formed is without an anneal process tends to be low. In addition, the presence of defects tends to increase leakage currents. In a completed capacitor, the anneal process tends to increase capacitance by about 20% with respect to a capacitor without annealing and to reduce leakage currents that occur when voltages are applied to the electrodes.

A dielectric layer consisting of any of various dielectric materials is formed on the tungsten nitride layer. Suitable dielectric materials include high-dielectric-constant materials such as tantalum pentoxide ($Ta_2O_5$), doped $Ta_2O_5$ such as Ti-doped $Ta_2O_5$, barium strontium titanium oxide (Ba, Sr)$TiO_3$, lead zirconium titanium oxide Pb(Zr,Ti)$O_3$, strontium bismuth tantalum oxide ($SrBi_2Ta_2O_9$), $BaTiO_3$, $SrTiO_3$, Pb(Zr,Ti)$O_3$, $SrBi_2Ta_2O_9$, $SrBi_2Nb_2O_9$, $SrBi_2$(Nb, Ta)$_2O_9$, (Pb,La)(Zr,Ti)$O_3$, $Al_2O_3$, $ZrO_2$, $HfO_2$, and $SiO_xN_y$. For $Ta_2O_5$, formation of a stoichiometric compound is preferred so that the $Ta_2O_5$ layer is not a tantalum rich layer, because tantalum rich $Ta_2O_5$ layers tend to be conducting, not insulating. Tantalum pentoxide dielectric layers are preferred in some applications because of its large dielectric constant and its stability. However, tantalum pentoxide is typically formed using a MOCVD process in an oxidizing ambient such as an oxygen, ozone, or $N_2O$ ambient. While many electrode layer materials cannot be exposed to oxidizing ambients, tungsten nitride is relatively unaffected by such ambients and therefore facilitates the use of tantalum pentoxide dielectric layers.

An electrode layer of tungsten nitride or other conducting material is formed on the dielectric layer and serves as a top electrode for the capacitor. Other suitable conducting materials include TiN, TiON, $WN_x$, TaN, Ta, Pt, Rh, Pt—Rh, Pt—RhO$_x$, Ru, RuO$_x$, Ir, IrO$_x$, Pt—Ru, Pt—RuO$_x$, Pt—Ir, Pt—IrO$_x$, $SrRuO_3$, Au, Pd, Al, Mo, Ag, polysilicon, and alloys thereof. These electrode materials can be formed by various processes. For example, ruthenium and platinum/rhodium are conveniently formed using a CVD process. After the dielectric layer and the electrode layers are formed, the capacitor is annealed as described above.

Figure 9A:
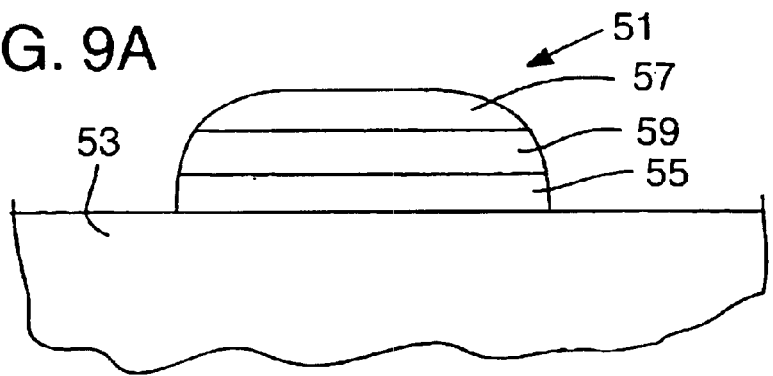
FIGS. 9A–9C are cross-sections of capacitor structures that include a tungsten nitride electrode layer.
Figure 9B:
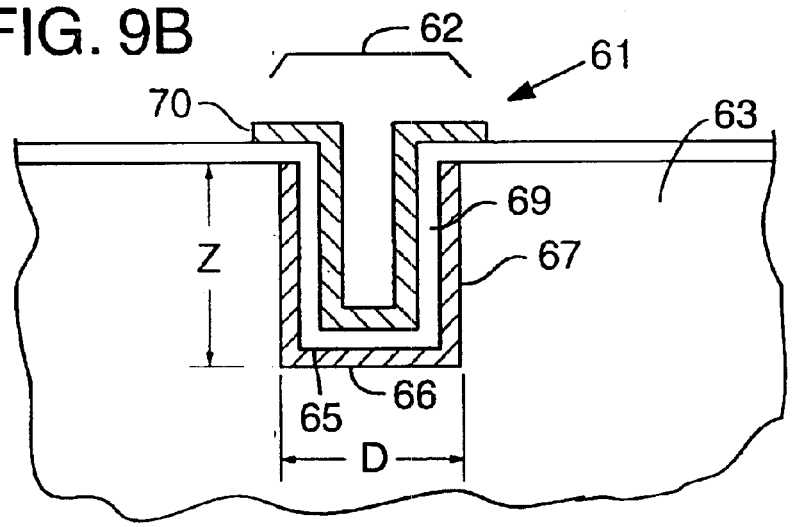
Figure 9C:
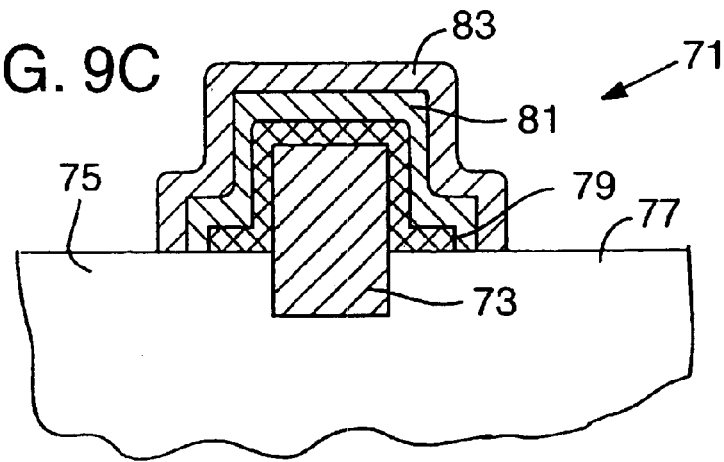

FIGS. 9A–9C illustrate several example capacitor geometries that include tungsten nitride electrodes. Referring to FIG. 9A, a plate capacitor 51 is formed on a surface of a substrate 53. The substrate 53 can be any of various substrate materials including GaAs, 10 silicon, or BPSG. The capacitor 51 includes a first electrode 55, a second electrode 57, and a dielectric layer 59. In a representative example, the first electrode 55 is a tungsten nitride layer, the dielectric layer 58 is a $Ta_2O_5$ layer, the second electrode is a TiN layer, and the substrate 53 is BPSG.

When voltages are applied to electrodes of a capacitor such as the capacitor 51, some electrical current flows between the electrodes. This current is generally undesirable and is referred to as a "leakage" current. Plate capacitors having electrodes of tungsten nitride have leakage currents of as little as about 20 nA/cm$^2$, or as low as about 5 nA/cm$^2$ for capacitors having dielectric layers 100 Angstroms thick and with an applied voltage of 1 V.

With reference to FIG. 9B, a container capacitor 61 is formed in an etched recess 62 in a substrate 63. A tungsten nitride electrode layer 65 covers a bottom surface 66 and a side surface 67 of the recess 62. A $Ta_2O_5$ dielectric layer 69 covers the electrode layer 65, substantially filling the recess 62 and a tungsten nitride electrode layer 71 (or other conductive layer) covers the dielectric layer 69. The dimensions of the recess 62 are selected to provide a desired capacitance, and can be selected in conjunction with a minimum feature size for other circuit elements that are formed on the substrate 63. In a representative example, the recess 62 has a diameter D of 200 nm and a depth Z of 1000 nm. For these dimensions, the tungsten nitride layer is preferably about 300 Angstroms (30 nm) thick. Tungsten nitride layers thinner than about 100 Angstroms (10 nm) tend to have voids. Because of these voids, such layers do not act as continuous electrodes, reducing the capacitance of the capacitor 61. Tungsten nitride layers thicker than about 1000 Angstroms (100 nm) tend to occupy too much of the volume of the recess 62, also limiting the capacitance of the capacitor 61. For container capacitors formed in larger recesses, thicker tungsten nitride layers can be used without sacrificing too much capacitance.

The recess 62 is generally formed in the substrate 63 with an etching process. If the substrate 63 is BPSG, the recess 62 can be formed with a dry etch process such as plasma etching. While other etching processes are possible, because the recess 62 is deeper than wide, a selected etch process is preferably anisotropic.

Referring to FIG. 9C, a stud capacitor 71 is formed on a plug 73 that extends from a surface 75 of a substrate 77. A tungsten nitride electrode layer 79 is formed on the plug 73 and is covered with a dielectric layer 81 and an electrode layer 83. The dielectric layer 81 and the electrode layer can be formed of any of the materials mentioned above. Representative materials are $Ta_2O_5$ and TiN for the dielectric layer 81 and the electrode layer 83, respectively. The plug 73 may be an electrically conductive plug of polysilicon or other electrically conductive material formed in a recess in the substrate 77 such as a borophosphosilicate glass (BPSG). The lower end of the plug typically electrically contacts a circuit element such as a transistor gate (not shown).

In the above examples, a tungsten nitride layer is deposited directly on a substrate such as BPSG. Alternatively, a tungsten nitride layer can be formed or deposited on a titanium nitride (TiN) adhesion layer, or other adhesion layer, to improve the bonding of the tungsten nitride layer to the substrate.

Variations within the scope and spirit of the disclosure above will be apparent to those of ordinary skill in the art. For example, the enhanced-surface-area layers can be used in ferroelectric memories to improve storage capacity. The scope of coverage is accordingly defined not by the particular example embodiments and variations explicitly described above, but by the claims below.

We claim:

1. An integrated circuit comprising:
   a supporting structure; and
   an enhanced-surface-area electrically conductive ruthenium-containing layer situated on the supporting structure, the ruthenium-containing layer having a non-textured surface adjacent the supporting structure and a textured surface with a mean feature size of at least about 100 Angstroms opposite the non-textured surface.

2. The integrated circuit of claim 1, wherein the ruthenium-containing layer includes a nitrogen-passivated portion at the textured surface.

3. The integrated circuit of claim 1, wherein the ruthenium-containing layer includes a nitrogen-passivated and oxygen-passivated portion at the textured surface.

4. The integrated circuit of claim 1, wherein the supporting structure is a plug formed in a dielectric material.

5. The integrated circuit of claim 1, wherein the supporting structure includes a plug that extends outwardly from a surface of the supporting structure.

6. The integrated circuit of claim 1, wherein the supporting structure is a plug formed in a dielectric material.

7. The integrated circuit of claim 1, wherein the supporting structure includes a plug that extends outwardly from a surface of the supporting structure.

8. An integrated circuit comprising:
   a supporting structure; and
   an enhanced-surface-area electrically conductive nitrogen-passivated ruthenium-containing layer situated on the supporting structure, the ruthenium-containing layer having a non-textured surface adjacent the supporting structure and a textured surface with a mean feature size of at least about 100 Angstroms opposite the non-textured surface.

9. An integrated circuit comprising:
   a supporting structure; and
   an enhanced-surface-area electrically conductive nitrogen-passivated and oxygen-passivated ruthenium-containing layer situated on the supporting structure, the ruthenium-containing layer having a non-textured surface adjacent the supporting structure and a textured surface with a mean feature size of at least about 100 Angstroms opposite the non-textured surface.

10. An integrated circuit comprising:
    a supporting structure that includes a conductive plug; and
    an enhanced-surface-area electrically conductive ruthenium-containing layer situated on the supporting structure, wherein the ruthenium-containing layer has a non-textured surface adjacent the supporting structure and a textured surface with a mean feature size of at least about 100 Angstroms opposite the non-textured surface.

11. The integrated circuit of claim 10, wherein the conductive plug extends outwardly from the supporting structure.

12. The integrated circuit of claim 10, wherein the conductive plug is situated in an opening in a dielectric material.

13. An integrated circuit comprising:
    a supporting structure; and
    an enhanced-surface-area electrically conductive ruthenium-containing layer situated on the supporting structure, the ruthenium-containing layer having a plurality of protrusions extending outwardly from a surface of the supporting structure, the protrusions having first major surfaces adjacent the supporting structure and second major surfaces facing outward from the surface of the supporting structure, wherein the first major surfaces are substantially planar and the second major surfaces are substantially non-planar and include portions that extend at least about 100 Angstroms from the first major surfaces.

* * * * *